(12) United States Patent
Fukuzumi et al.

(10) Patent No.: US 6,972,992 B1
(45) Date of Patent: Dec. 6, 2005

(54) TUNNELING MAGNETORESISTIVE RANDOM ACCESS MEMORY WITH A MULTILAYER FIXED LAYER

(75) Inventors: Yoshiaki Fukuzumi, Yokohama (JP); Toshihiko Nagase, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/000,995

(22) Filed: Dec. 2, 2004

(30) Foreign Application Priority Data

Jul. 13, 2004 (JP) .............................. 2004-205845

(51) Int. Cl.$^7$ ........................................... G11C 11/15
(52) U.S. Cl. ....................... 365/173; 365/171; 365/158
(58) Field of Search .............................. 365/173, 171, 365/158

(56) References Cited

U.S. PATENT DOCUMENTS

| 6,721,146 B2 * | 4/2004 | Beach ................... 360/324.12 |
| 6,775,903 B2 * | 8/2004 | Horng et al. ............. 29/603.14 |
| 2002/0131218 A1 * | 9/2002 | Beach ................... 360/324.12 |
| 2004/0047177 A1 | 3/2004 | Fukuzumi ................... 365/157 |

FOREIGN PATENT DOCUMENTS

JP 2004-103125 4/2004 .......... G11C 11/15

OTHER PUBLICATIONS

Masashige Sato, et al., "Spin-Valve-Like Properties of Ferromagnetic Tunnel Junctions", Jpn. J. Appl. Phys., vol. 36, Feb. 15, 1997, pp. L200-L201.

* cited by examiner

Primary Examiner—Andrew Q. Tran
(74) Attorney, Agent, or Firm—Oblon, Spivak, McClelland, Maier & Neustadt, PC (57) ABSTRACT

A magnetic random access memory includes a magnetoresistive element which has a recording layer, a fixed layer, and a tunnel barrier layer arranged between the recording layer and the fixed layer, the fixed layer comprising an anti-ferromagnetic layer, a first ferromagnetic layer which is in contact with the anti-ferromagnetic layer, a second ferromagnetic layer which is magnetically coupled with the first ferromagnetic layer by first magnetic coupling, a third ferromagnetic layer which is magnetically coupled with the second ferromagnetic layer by second magnetic coupling, a first nonmagnetic layer which is formed between the first and second ferromagnetic layers, and a second nonmagnetic layer which is formed between the second and third ferromagnetic layers and has a thickness different from a thickness of the first nonmagnetic layer.

20 Claims, 5 Drawing Sheets

TUNNELING MAGNETORESISTIVE RANDOM ACCESS MEMORY WITH A MULTILAYER FIXED LAYER

CROSS-REFERENCE TO RELATED APPLICATIONS

This application is based upon and claims the benefit of priority from prior Japanese Patent Application No. 2004-205845, filed Jul. 13, 2004, the entire contents of which are incorporated herein by reference.

BACKGROUND OF THE INVENTION

1. Field of the Invention

The present invention relates to an MRAM (Magnetic Random Access Memory) having a magnetoresistive element.

2. Description of the Related Art

In recent years, an MRAM (Magnetic Random Access Memory) using a TMR (Tunnel Magneto-Resistance) effect has been proposed as a kind of semiconductor memory.

In each memory cell of an MRAM, an MTJ (Magnetic Tunneling Junction) element serving as an information storage element is formed at the interconnection between a bit line and a word line. In a data write mode, a current is supplied to each of a selected bit line and a selected word line. Data is written in the MTJ element of the selected cell located at the intersection between the selected bit line and the selected word line by a synthetic magnetic field generated by the currents. In a data read mode, a read current is supplied to the MTJ element of a selected cell so that "1" or "0" data is read out in accordance with a resistance change in the magnetized state of the MTJ element.

Figure 9:
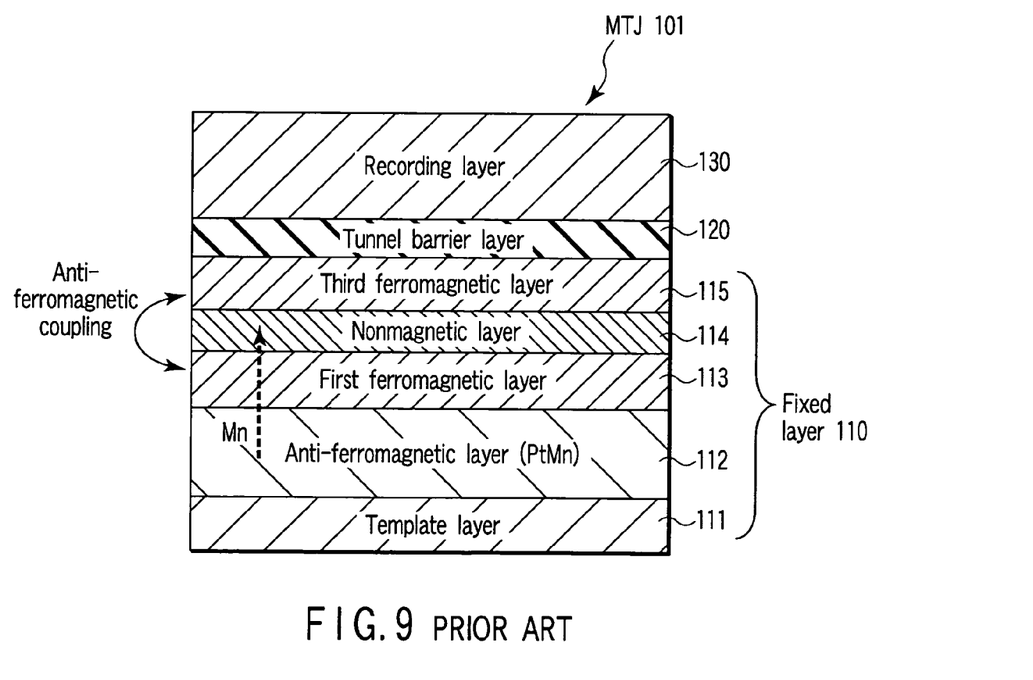
FIG. 9 is a sectional view showing an MTJ element in a conventional magnetic random access memory.

An MTJ element 101 used in the MRAM includes a fixed layer 110, a recording layer 130, and a tunnel barrier layer 120 sandwiched between the fixed layer 110 and the recording layer 130, as shown in FIG. 9. The fixed layer 110 includes a template layer 111, an anti-ferromagnetic layer 112, and first and second ferromagnetic layers 113 and 115 which are anti-ferromagnetically coupled via a nonmagnetic layer 114.

Such an MRAM is suitable for a logic embedded memory because of its characteristic features such as a high operation speed and nonvolatility. However, it is difficult to put it into practical use because of annealing in the post process used in the logic process.

More specifically, by annealing in the logic process, Mn in the anti-ferromagnetic layer 112 formed from, e.g., PtMn is diffused into the nonmagnetic layer 114 so that anti-ferromagnetic coupling via the nonmagnetic layer 114 degrades. In addition, Mn is partially diffused to near the interface of the tunnel barrier layer 120. Accordingly, the pinning characteristic of the fixed layer 110 degrades, and the MR (Magneto Resistive) ratio (the resistance ratio between "1" and "0" data) becomes low.

Prior-art references associated with the present invention of this application are as follows.

[Patent reference 1] Jpn. Pat. Appln. KOKAI Publication No. 2004-103125

[Non-patent reference 1] Masashige Sato and Kazuo Kobayashi, "Spin-Valve-Like Properties of Ferromagnetic Tunnel Junctions", Jpn. J. Appl. Phys. Vol. 36 (1997), pp. L200–L201.

BRIEF SUMMARY OF THE INVENTION

According to an aspect of the present invention, there is provided a magnetic random access memory comprises a magnetoresistive element which has a recording layer, a fixed layer, and a tunnel barrier layer arranged between the recording layer and the fixed layer, the fixed layer comprising an anti-ferromagnetic layer, a first ferromagnetic layer which is in contact with the anti-ferromagnetic layer, a second ferromagnetic layer which is magnetically coupled with the first ferromagnetic layer by first magnetic coupling, a third ferromagnetic layer which is magnetically coupled with the second ferromagnetic layer by second magnetic coupling, a first nonmagnetic layer which is formed between the first and second ferromagnetic layers, and a second nonmagnetic layer which is formed between the second and third ferromagnetic layers and has a thickness different from a thickness of the first nonmagnetic layer.

DETAILED DESCRIPTION OF THE INVENTION

An embodiment of the present invention will be described below with reference to the accompanying drawing. In the description, the same reference numerals denote the common parts throughout the drawing.

[1] Structure of MTJ Element

Figure 1:
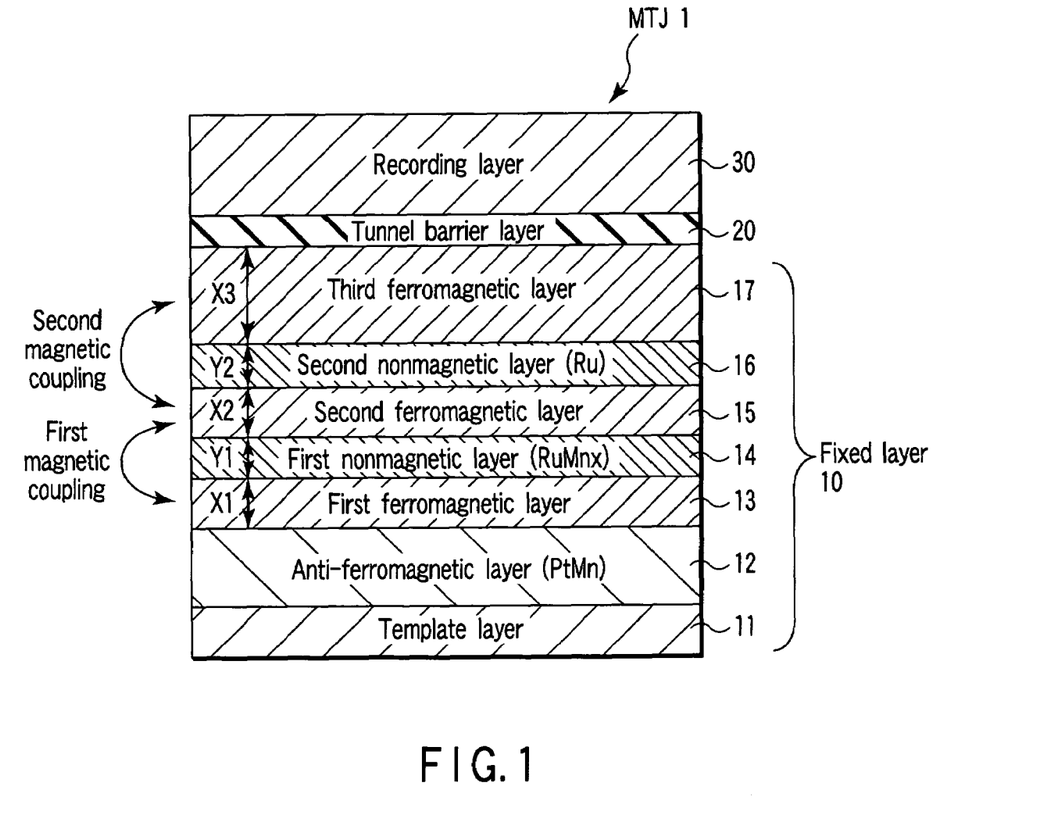
FIG. 1 is a sectional view showing an MTJ element in a magnetic random access memory according to an embodiment of the present invention.

FIG. 1 is a sectional view of an MTJ element in a magnetic random access memory according to an embodiment of the present invention. The structure of the MTJ element (magnetoresistive element) functioning as a storage element in the magnetic random access memory according to the embodiment of the present invention will be described below.

As shown in FIG. 1, an MTJ element 1 includes a fixed layer (pinning layer) 10 having fixed magnetization, a recording layer (free layer) 30 having rotational magnetization, and a tunnel barrier layer 20 sandwiched between the fixed layer 10 and the recording layer 30.

The fixed layer 10 of the MTJ element 1 has a multilayered structure to be described below. An anti-ferromagnetic layer 12 is formed on a template layer 11. Three, first to third ferromagnetic layers 13, 15, and 17 are formed on the anti-ferromagnetic layer 12. A first nonmagnetic layer 14 is inserted between the first ferromagnetic layer 13 and second ferromagnetic layer 15. A second nonmagnetic layer 16 is inserted between the second ferromagnetic layer 15 and the third ferromagnetic layer 17.

The thickness of the first nonmagnetic layer 14 is different from that of the second nonmagnetic layer 16. The first nonmagnetic layer 14 is preferably thicker than the second nonmagnetic layer 16.

[2] Materials of MTJ Element

Figure 2A:
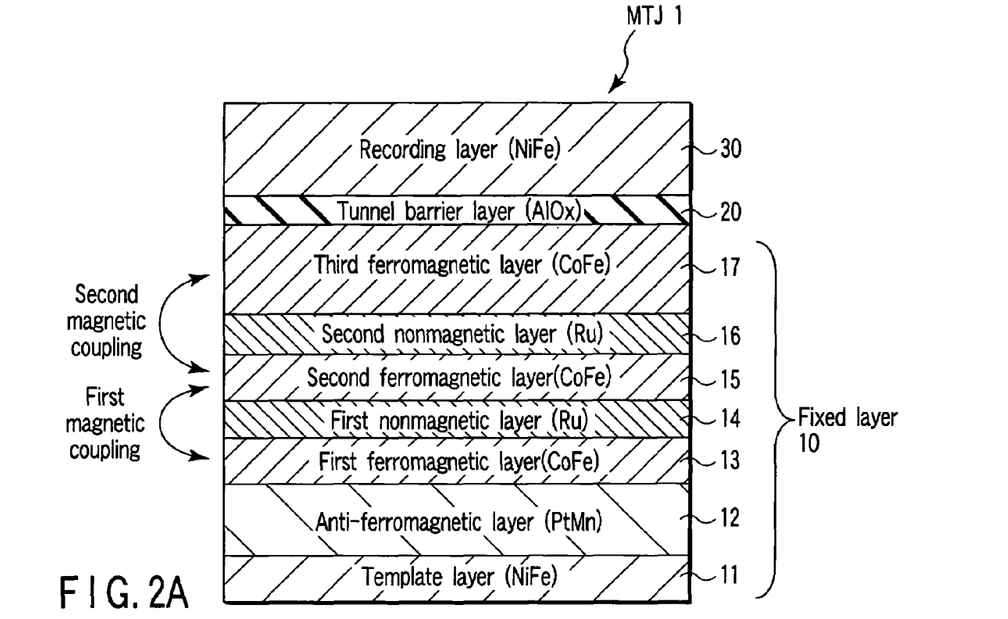
FIG. 2A is a sectional view showing the MTJ element before annealing in the magnetic random access memory according to the embodiment of the present invention.
Figure 2B:
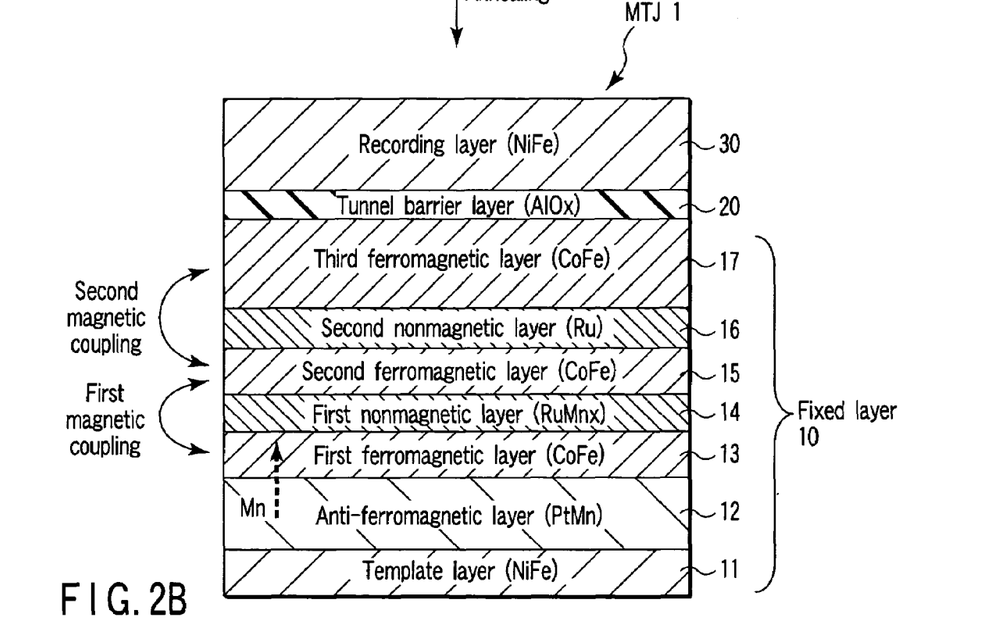
FIG. 2B is a sectional view showing the MTJ element after annealing in the magnetic random access memory according to the embodiment of the present invention.

FIG. 2A is a sectional view of the MTJ element before annealing in the magnetic random access memory according to the embodiment of the present invention. FIG. 2B is a sectional view showing the MTJ element after annealing in the magnetic random access memory according to the embodiment of the present invention. The materials of the MTJ element of the magnetic random access memory according to the embodiment of the present invention will be described below.

As shown in FIG. 2A, the template layer 11 is made of, e.g., NiFe. The anti-ferromagnetic layer 12 is made of, e.g., PtMn. The first to third ferromagnetic layers 13, 15, and 17 are made of, e.g., CoFe. The tunnel barrier layer 20 is made of, e.g., $AlO_x$. The recording layer 30 is made of, e.g., NiFe.

The first and second nonmagnetic layers 14 and 16 are made of, e.g., Ru (FIG. 2A). To stop Mn which is diffused from the anti-ferromagnetic layer 12 by annealing, the first nonmagnetic layer 14 contains Mn and therefore is made of, e.g., $RuMn_x$ (FIG. 2B).

Hence, the first nonmagnetic layer 14 contains Mn at a content of, e.g., about 2% to 10% after annealing. The second nonmagnetic layer 16 may also contain Mn diffused from the anti-ferromagnetic layer 12 at, e.g., about 1% or less.

The first to third ferromagnetic layers 13, 15, and 17 and recording layer 30 may be formed from, e.g., Fe, Co, Ni, or an alloy thereof, magnetite having a high spin polarizability, an oxide such as $CrO_2$ or $RXMnO_{3-y}$ (R: rare earth, X: Ca, Ba, or Sr), or a Heusler alloy such as NiMnSb or PtMnSb. The magnetic materials may contain a small content of a nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

The first and second nonmagnetic layers 14 and 16 may be formed from various nonmagnetic materials such as Cu, Ir, Pt, Pd, Rh, Re, Os, V, Cr, Nb, Mo, Ta, W, $Al_2O_3$, $SiO_2$, MgO, AlN, $Bi_2O_3$, $MgF_2$, $CaF_2$, $SrTiO_2$, or $AlLaO_3$. The first and second nonmagnetic layers 14 and 16 are preferably made of Ru when they are to be anti-ferromagnetically coupled or Cu when they are to be ferromagnetically coupled.

The anti-ferromagnetic layer 12 may be formed from, e.g., FeMn, PtCrMn, NiMn, or IrMn.

The tunnel barrier layer 20 may be formed from various nonmagnetic materials such as $SiO_2$, MgO, AlN, $Bi_2O_3$, $MgF_2$, $CaF_2$, $SrTiO_2$, or $AlLaO_3$.

When the above-described materials are used, the first and second nonmagnetic layers 14 and 16 may be formed from the same material or different materials. Even the first to third ferromagnetic layers 13, 15, and 17 may be formed from the same material or different materials.

[3] Magnetic Coupling State of Fixed Layer

Figure 3:
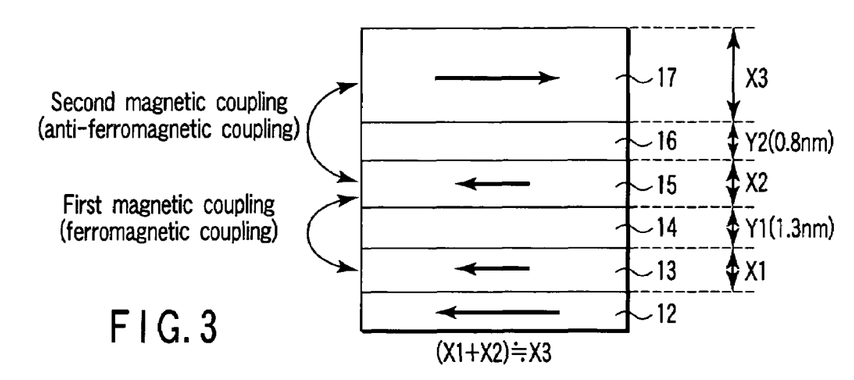
FIG. 3 is a schematic view showing the fixed layer of the MTJ element in the magnetic random access memory according to the embodiment of the present invention when the first magnetic coupling is ferromagnetic coupling, and the second magnetic coupling is anti-ferromagnetic coupling.
Figure 4:
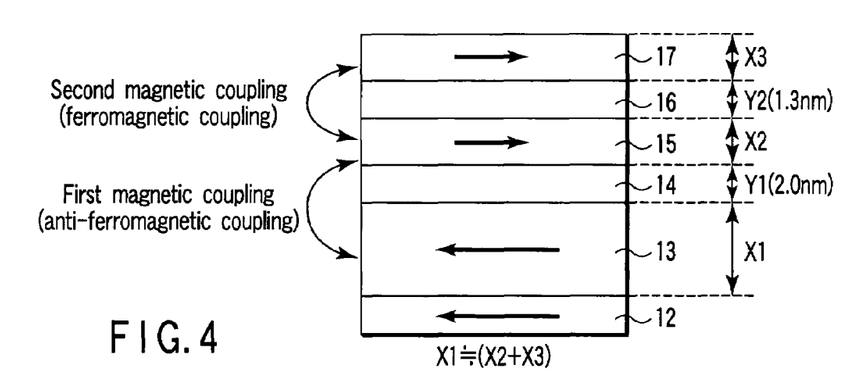
FIG. 4 is a schematic view showing the fixed layer of the MTJ element in the magnetic random access memory according to the embodiment of the present invention when the first magnetic coupling is anti-ferromagnetic coupling, and the second magnetic coupling is ferromagnetic coupling.
Figure 5:
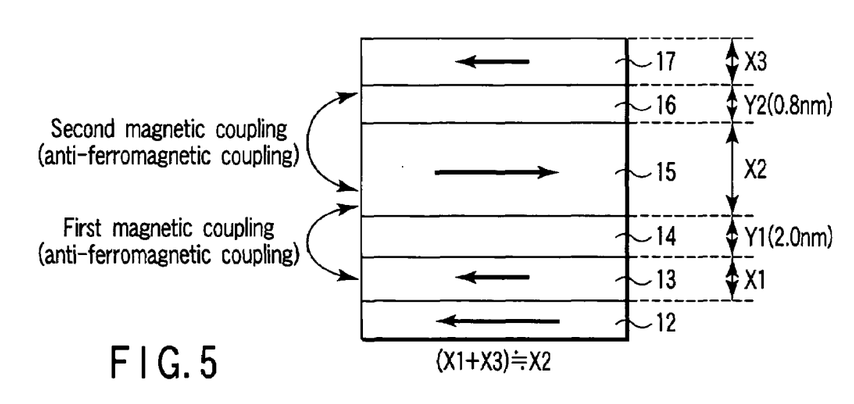
FIG. 5 is a schematic view showing the fixed layer of the MTJ element in the magnetic random access memory according to the embodiment of the present invention when both the first and second magnetic coupling are anti-ferromagnetic coupling.

FIGS. 3 to 5 are schematic views showing the magnetic coupling states of the fixed layer included in the MTJ element of the magnetic random access memory according to the embodiment of the present invention. The magnetic coupling states of the fixed layer according to the embodiment of the present invention will be described below.

As shown in FIGS. 3 to 5, the first ferromagnetic layer 13 and second ferromagnetic layer 15 are magnetically coupled (interlayer coupling) via the first nonmagnetic layer 14 (this will be referred to as first magnetic coupling hereinafter). The second ferromagnetic layer 15 and third ferromagnetic layer 17 are magnetically coupled via the second nonmagnetic layer 16 (this will be referred to as second magnetic coupling hereinafter).

For the first and second magnetic coupling, three states are possible: (1) the first magnetic coupling is ferromagnetic coupling, and the second magnetic coupling is anti-ferromagnetic coupling (FIG. 3), (2) the first magnetic coupling is anti-ferromagnetic coupling, and the second magnetic coupling is ferromagnetic coupling (FIG. 4), and (3) both the first and second magnetic coupling are anti-ferromagnetic coupling (FIG. 5). In ferromagnetic coupling, a stable state is obtained when the magnetization directions are parallel. In anti-ferromagnetic coupling, a stable state is obtained when the magnetization directions are anti-parallel.

The reason why the case in which both the first and second magnetic coupling are ferromagnetic coupling is left out of consideration is as follows. In this case, since all layers in the fixed layer 10 have the same magnetization direction, the fixed layer 10 cannot cancel the leakage field to the recording layer 30. That is, since the magnetization reversal in the recording layer 30 shifts in one direction, the write selectivity becomes poor, resulting in a problem in operation.

In annealing in the post process of the logic process, diffusion of Mn atoms in the anti-ferromagnetic layer 12 made of PtMn is blocked by Ru in the first nonmagnetic layer 14. The first nonmagnetic layer 14 contains Mn atoms.

In (1), when the Mn diffusion amount is small, the ferromagnetic coupling between the first and second ferromagnetic layers 13 and 15 via the first nonmagnetic layer 14 degrades because the first nonmagnetic layer 14 contains Mn atoms. However, the ferromagnetic coupling is maintained. On the other hand, when the Mn diffusion amount is large, the interlayer ferromagnetic coupling is partially lost. However, the first and second ferromagnetic layers 13 and 15 maintain the interlayer ferromagnetic coupling at the remaining portions. Hence, the ferromagnetic coupling can be maintained in the whole layer. At a portion where interlayer coupling is lost, the ferromagnetic coupling itself can be maintained by another mechanism such as coupling through pin holes or direct magnetic coupling by diffusion in the first and second ferromagnetic layers 13 and 15 and first nonmagnetic layer 14, which occurs simultaneously with Mn diffusion. For this reason, any degradation which impedes the fixed layer 10 from functioning can be avoided.

Similarly, in (2), when the Mn diffusion amount is small, the anti-ferromagnetic coupling between the first and second ferromagnetic layers 13 and 15 via the first nonmagnetic layer 14 degrades because the first nonmagnetic layer 14 contains Mn atoms. However, the anti-ferromagnetic coupling is maintained. On the other hand, when the Mn diffusion amount is large, the interlayer anti-ferromagnetic coupling is partially lost. However, the first and second ferromagnetic layers 13 and 15 maintain the interlayer anti-ferromagnetic coupling at the remaining portions. Hence, the ferromagnetic coupling can be maintained in the whole layer. In anti-ferromagnetic coupling, since the leakage fields act to maintain each other's magnetization, the anti-ferromagnetic coupling can be maintained. The magnitude of leakage field changes depending on the element size and the saturated magnetization and thickness of a ferromagnetic material. Hence, the element size and the saturation magnetization and thickness of a ferromagnetic material can be selected such that anti-ferromagnetic coupling can be obtained by leakage fields.

In (1), when the first nonmagnetic layer 14 contains Mn in a large amount, it functions as an anti-ferromagnetic layer. For example, when the first nonmagnetic layer 14 is made of Ir, it changes to $IrMn_x$ and can function as an anti-ferromagnetic layer.

[4] Thicknesses of Ferromagnetic Layers in Fixed Layer

Thicknesses X1, X2, and X3 of the first to third ferromagnetic layers 13, 15, and 17 in the fixed layer 10 are preferably defined to reduce the leakage field from the fixed layer 10. Hence, the thicknesses X1, X2, and X3 of the first to third ferromagnetic layers 13, 15, and 17 are defined as follows by the three magnetic coupling states of the first and second magnetic coupling.

(1) When the first magnetic coupling is ferromagnetic coupling, and the second magnetic coupling is anti-ferromagnetic coupling, the total thickness (X1+X2) of the first and second ferromagnetic layers 13 and 15 preferably equals the thickness X3 of the third ferromagnetic layer 17, as shown in FIG. 3. Accordingly, the leakage field generated toward the left of the drawing surface by the magnetization of the first and second ferromagnetic layers 13 and 15 and the leakage field generated toward the right of the drawing surface by the magnetization of the third ferromagnetic layer 17 can cancel each other.

(2) When the first magnetic coupling is anti-ferromagnetic coupling, and the second magnetic coupling is ferromagnetic coupling, the thickness X1 of the first ferromagnetic layer 13 preferably equals the total thickness (X2+X3) of the second and third ferromagnetic layers 15 and 17, as shown in FIG. 4. Accordingly, the leakage field generated toward the left of the drawing surface by the magnetization of the first ferromagnetic layer 13 and the leakage field generated toward the right of the drawing surface by the magnetization of the second and third ferromagnetic layers 15 and 17 can cancel each other.

(3) When both the first and second magnetic coupling are anti-ferromagnetic coupling, the total thickness (X1+X3) of the first and third ferro-magnetic layers 13 and 17 preferably equals the thickness X2 of the second ferromagnetic layer 15, as shown in FIG. 5. Accordingly, the leakage field generated toward the left of the drawing surface by the magnetization of the first and third ferromagnetic layers 13 and 17 and the leakage field generated toward the right of the drawing surface by the magnetization of the second ferromagnetic layer 15 can cancel each other.

The thicknesses X1 and X2 of the first and second ferromagnetic layers 13 and 15 in (1), the thicknesses X2 and X3 of the second and third ferromagnetic layers 15 and 17 in (2), or the thicknesses X1 and X3 of the first and third ferromagnetic layers 13 and 17 in (3) may be set to be equal to each other or different from each other.

[5] Thicknesses of Nonmagnetic Layers in Fixed Layer

Figure 6:
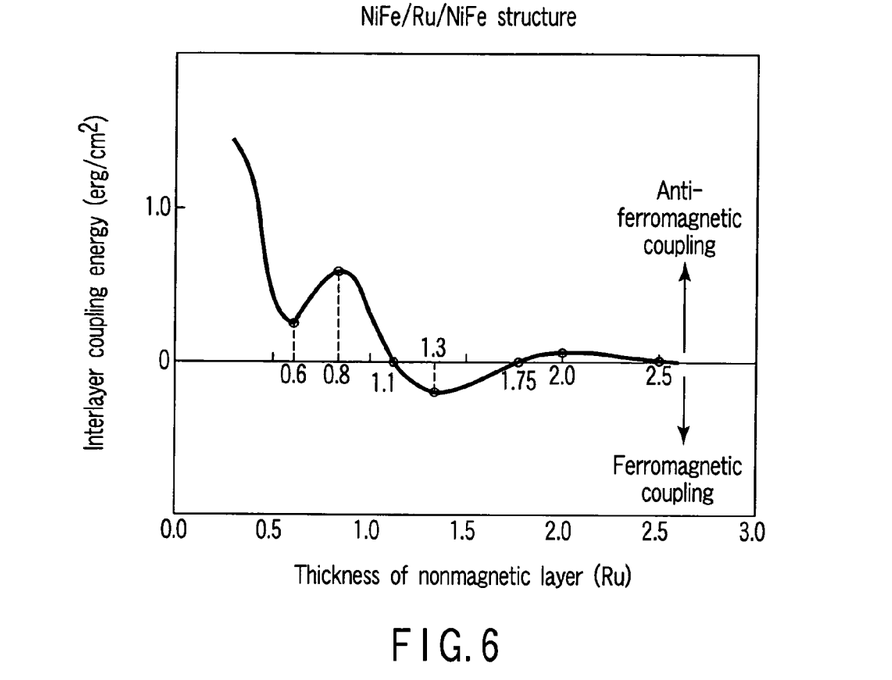
FIG. 6 is a graph showing the relationship between the thickness of Ru and the interlayer coupling energy when the fixed layer has an Nife/Ru/NiFe structure in the MTJ element in the magnetic random access memory according to the embodiment of the present invention.

FIG. 6 shows the relationship between the thickness of Ru and the interlayer coupling energy when the fixed layer has an Nife/Ru/NiFe structure in the MTJ element in the magnetic random access memory according to the embodiment of the present invention. The thicknesses of the nonmagnetic layers in the fixed layer according to the embodiment of the present invention will be described below.

Thicknesses Y1 and Y2 of the first and second nonmagnetic layers 14 and 16 in the fixed layer 10 are preferably defined such that the ferromagnetic layers on the upper and lower sides have anti-ferromagnetic coupling or ferromagnetic coupling. In this case, the thicknesses Y1 and Y2 of the first and second nonmagnetic layers 14 and 16 are defined assuming that the first to third ferromagnetic layers 13, 15, and 17 are formed from, e.g., NiFe, and the first and second nonmagnetic layers 14 and 16 are formed from Ru.

As shown in FIG. 6, the interlayer coupling energy changes while oscillating from anti-ferromagnetic coupling to ferromagnetic coupling depending on a change in thickness of Ru. Referring to FIG. 6, the positive side of the interlayer coupling energy indicates anti-ferromagnetic coupling, and the negative side indicates ferromagnetic coupling.

If two ferromagnetic layers are to be anti-ferromagnetically coupled, the thickness of the nonmagnetic layer made of Ru and sandwiched between the ferromagnetic layers is set to, e.g., about 0.6 to 1.0 nm or about 1.9 to 2.3 nm. Especially, the thickness is set to 0.8 nm or 2.0 nm at which the interlayer coupling energy is large.

On the other hand, if two ferromagnetic layers are to be ferromagnetically coupled, the thickness of the nonmagnetic layer made of Ru and sandwiched between the ferromagnetic layers is set to, e.g., about 1.2 to 1.7 nm. Especially, the thickness is preferably 1.3 nm at which the interlayer coupling energy is large.

More specifically, in the magnetic coupling states (1) to (3) shown in FIGS. 3 to 5, when the first and second nonmagnetic layers 14 and 16 are formed from Ru, the thicknesses Y1 and Y2 of the first and second nonmagnetic layers 14 and 16 are defined as follows.

In (1) shown in FIG. 3, the thickness Y1 of the first nonmagnetic layer 14 is set to, e.g., 1.3 nm such that the first and second ferromagnetic layers 13 and 15 are ferromagnetically coupled. On the other hand, the thickness Y2 of the second nonmagnetic layer 16 is set to, e.g., 0.8 nm such that the second and third ferromagnetic layers 15 and 17 are anti-ferromagnetically coupled.

In (2) shown in FIG. 4, the thickness Y1 of the first nonmagnetic layer 14 is set to, e.g., 2.0 nm such that the first and second ferromagnetic layers 13 and 15 are anti-ferromagnetically coupled. On the other hand, the thickness Y2 of the second nonmagnetic layer 16 is set to, e.g., 1.3 nm such that the second and third ferromagnetic layers 15 and 17 are ferromagnetically coupled.

In (3) shown in FIG. 5, the thickness Y1 of the first nonmagnetic layer 14 is set to, e.g., 2.0 nm such that the first and second ferromagnetic layers 13 and 15 are anti-ferromagnetically coupled. On the other hand, the thickness Y2 of the second nonmagnetic layer 16 is set to, e.g., 0.8 nm such that the second and third ferromagnetic layers 15 and 17 are anti-ferromagnetically coupled.

In all of the magnetic coupling states (1) to (3), of the first and second nonmagnetic layers 14 and 16, the thickness Y1 of the first nonmagnetic layer 14 located near the anti-ferromagnetic layer 12 is larger than the thickness Y2 of the second nonmagnetic layer 16 located far from the anti-ferromagnetic layer 12. In other words, the interlayer coupling energy of the second magnetic coupling is larger than that of the first magnetic coupling.

The above-described example is one embodiment of the present invention, which has described about the thicknesses of the nonmagnetic layers in the fixed layer. The magnitude of the interlayer coupling energy or the period of the change from anti-ferromagnetic coupling to ferromagnetic coupling while oscillating changes depending on the materials of the fixed layer and nonmagnetic layers. This is disclosed in, e.g., S. S. P. Parkin et al., Phys. Rev. Lett. 64 (1990), pp. 2304–2307 and S. S. P. Parkin, Phys. Rev. Lett. 67 (1991), pp. 3598–3601. For this reason, the nonmagnetic layers must be set to thicknesses appropriate for the material.

[6] Structure of Memory Cell

In the magnetic random access memory according to the embodiment of the present invention, the structure of the memory cell can be applied to various types.

Figure 7:
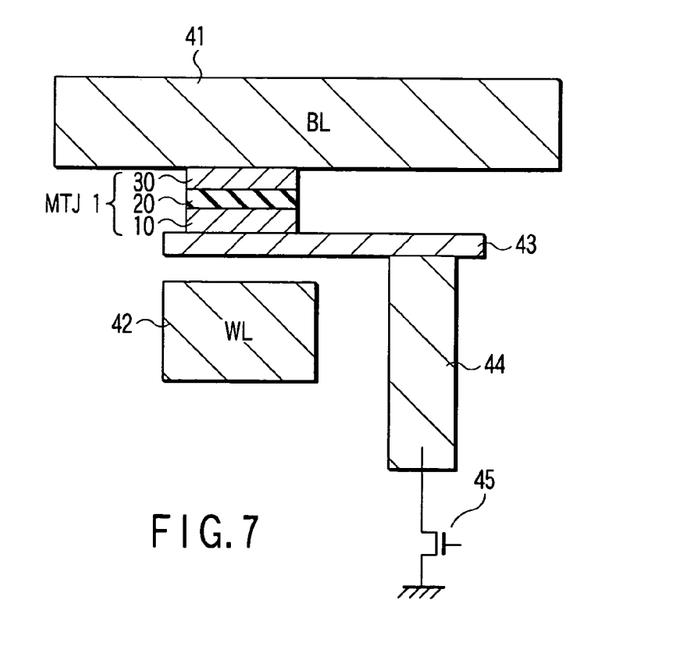
FIG. 7 is a sectional view showing a memory cell having a 1 Tr+1 MTJ structure in the magnetic random access memory according to the embodiment of the present invention.

For example, as shown in FIG. 7, the MTJ element 1 is arranged at the intersection between a bit line 41 and a word line 42. One terminal of the MTJ element 1 is electrically connected to the bit line 41. The other terminal of the MTJ element 1 is electrically connected to a read switching element (e.g., a MOS transistor) 45 through a lower metal layer 43 and a contact 44. The present invention can be applied to the memory cell having a so-called 1 Tr+1 MTJ structure including one transistor and one MTJ element in one cell.

Figure 8:
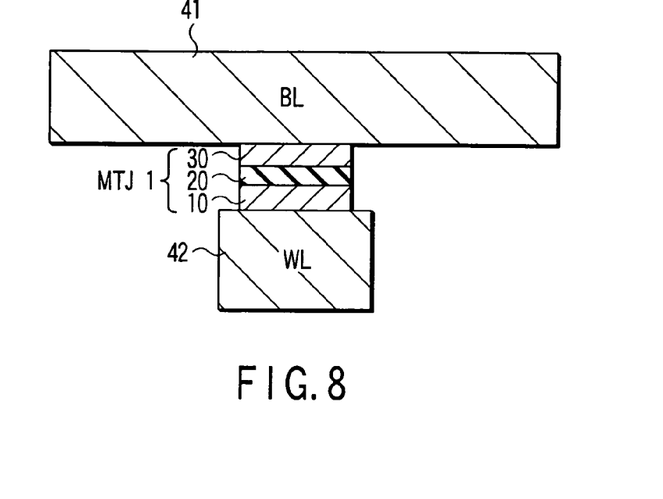
FIG. 8 is a sectional view showing a memory cell having a cross-point structure in the magnetic random access memory according to the embodiment of the present invention.

Alternatively, as shown in FIG. 8, the MTJ element 1 is arranged at the intersection between the bit line 41 and the word line 42. One terminal of the MTJ element 1 is electrically connected to the bit line 41. The other terminal of the MTJ element 1 is electrically connected to the word line 42. The present invention can also be applied to the memory cell having a so-called cross-point structure having no read switching element for each cell.

According to the embodiment of the present invention, even when Mn in the anti-ferromagnetic layer 12 formed from, e.g., PtMn is diffused to the first nonmagnetic layer 14 by annealing in the logic process, the first nonmagnetic layer 14 made of, e.g., Ru functions as an anti-diffusion layer for Mn. Since diffusion of Mn in the MTJ element 1 can be prevented, the first and second magnetic coupling can be suppressed from breaking. Hence, since any degradation in pinning characteristic of the fixed layer 10 can be avoided, the degradation in MR characteristic can be suppressed. As described above, according to the embodiment of the present invention, a heat-resistant MRAM which can be mounted in a hybrid logic process can be implemented.

When no new material is introduced to the first nonmagnetic layer 14, and a material easier to process control than a compound is used for the first nonmagnetic layer 14, the MRAM can be put into practical use.

The multilayered structure of the fixed layer 10 is not limited to the three-layered structure including the first to third ferromagnetic layers 13, 15, and 17. The number of ferromagnetic layers may be increased. Alternatively, nonmagnetic layers having a multilayered structure may be used to increase the heat resistance. In addition, the multilayered structure of the fixed layer 10 may be applied to the recording layer 30.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising a magnetoresistive element which has a recording layer, a fixed layer, and a tunnel barrier layer arranged between the recording layer and the fixed layer,
   the fixed layer comprising
   an anti-ferromagnetic layer,
   a first ferromagnetic layer which is in contact with the anti-ferromagnetic layer,
   a second ferromagnetic layer which is magnetically coupled with the first ferromagnetic layer by first magnetic coupling,
   a third ferromagnetic layer which is magnetically coupled with the second ferromagnetic layer by second magnetic coupling,
   a first nonmagnetic layer which is formed between the first and second ferromagnetic layers, and
   a second nonmagnetic layer which is formed between the second and third ferromagnetic layers and has a thickness different from a thickness of the first nonmagnetic layer.

2. The memory according to claim 1, wherein the first nonmagnetic layer contains Mn.

3. The memory according to claim 1, wherein the first nonmagnetic layer contains Mn at 2% to 10%.

4. The memory according to claim 1, wherein the second nonmagnetic layer contains Mn.

5. The memory according to claim 1, wherein the second nonmagnetic layer contains Mn at not more than 1%.

6. The memory according to claim 1, wherein the first nonmagnetic layer and the second nonmagnetic layer are layers containing one of Ru, Cu, Ir, Pt, Pd, Rh, Re, Os, V, Cr, Nb, Mo, Ta, and W.

7. The memory according to claim 1, wherein the thickness of the first nonmagnetic layer is larger than the thickness of the second nonmagnetic layer.

8. The memory according to claim 1, wherein an interlayer coupling energy of the second magnetic coupling is larger than an interlayer coupling energy of the first magnetic coupling.

9. The memory according to claim 1, wherein the first magnetic coupling is ferromagnetic coupling and the second magnetic coupling is anti-ferromagnetic coupling.

10. The memory according to claim 9, wherein
the thickness of the first nonmagnetic layer is 1.2 to 1.7 nm, and
the thickness of the second nonmagnetic layer is 0.6 to 1.0 nm.

11. The memory according to claim 9, wherein a total thickness of the first ferromagnetic layer and the second ferromagnetic layer substantially equals a thickness of the third ferromagnetic layer.

12. The memory according to claim 11, wherein thicknesses of the first ferromagnetic layer and the second ferromagnetic layer substantially equal each other.

13. The memory according to claim 1, wherein the first magnetic coupling is anti-ferromagnetic coupling and the second magnetic coupling is ferromagnetic coupling.

14. The memory according to claim 13, wherein
the thickness of the first nonmagnetic layer is 1.9 to 2.3 nm, and
the thickness of the second nonmagnetic layer is 1.2 to 1.7 nm.

15. The memory according to claim 13, wherein a thickness of the first ferromagnetic layer substantially equals a total thickness of the second ferromagnetic layer and the third ferromagnetic layer.

16. The memory according to claim 15, wherein thicknesses of the second ferromagnetic layer and the third ferromagnetic layer substantially equal each other.

17. The memory according to claim 1, wherein the first magnetic coupling is anti-ferromagnetic coupling and the second magnetic coupling is anti-ferromagnetic coupling.

18. The memory according to claim 17, wherein
the thickness of the first nonmagnetic layer is 1.9 to 2.3 nm, and
the thickness of the second nonmagnetic layer is 0.6 to 1.0 nm.

19. The memory according to claim 17, wherein a total thickness of the first ferromagnetic layer and the third ferromagnetic layer substantially equals a thickness of the second ferromagnetic layer.

20. The memory according to claim 19, wherein thicknesses of the first ferromagnetic layer and the third ferromagnetic layer substantially equal each other.

* * * * *